(12) United States Patent
Kim et al.

(10) Patent No.: US 10,113,230 B2
(45) Date of Patent: Oct. 30, 2018

(54) FORMATION METHOD OF HEXAGONAL BORON NITRIDE THICK FILM ON A SUBSTRATE AND HEXAGONAL BORON NITRIDE THICK FILM LAMINATES THEREBY

(71) Applicant: Korea Institute of Science and Technology (KIST), Seoul (KR)

(72) Inventors: Soo-Min Kim, Jeollabuk-do (KR); Ki-Kang Kim, Seoul (KR); Joo-Song Lee, Jeollabuk-do (KR)

(73) Assignee: KOREA INSTITUTE OF SCIENCE AND TECHNOLOGY (KIST), Seoul (KR)

( * ) Notice: Subject to any disclaimer, the term of this patent is extended or adjusted under 35 U.S.C. 154(b) by 62 days.

(21) Appl. No.: 15/055,290

(22) Filed: Feb. 26, 2016

(65) Prior Publication Data

US 2016/0281221 A1 Sep. 29, 2016

(30) Foreign Application Priority Data

Mar. 27, 2015 (KR) ........................ 10-2015-0043309

(51) Int. Cl.
*C23C 16/02* (2006.01)
*C23C 16/34* (2006.01)
*C23C 16/01* (2006.01)
*C23C 16/56* (2006.01)
(Continued)

(52) U.S. Cl.
CPC ........ *C23C 16/342* (2013.01); *C01B 21/0641* (2013.01); *C23C 16/01* (2013.01);
(Continued)

(58) Field of Classification Search
USPC ................. 205/76, 717; 427/331, 402, 419.7
See application file for complete search history.

(56) References Cited

U.S. PATENT DOCUMENTS

2004/0058199 A1   3/2004  Sakamoto et al.
2011/0256386 A1*  10/2011  Shi .................. C23C 16/342
                                                         205/76
(Continued)

FOREIGN PATENT DOCUMENTS

JP   2008-007388 A    1/2008
KR   100433322 B1     6/2004
(Continued)

OTHER PUBLICATIONS

Kim et al "Growth of High0rystalline, Single-Layer Hexagonal Nitride on Recyclable Platinum Foil" Nano Letters (2013) p. 1834-1839.*

(Continued)

*Primary Examiner* — Archene A Turner
(74) *Attorney, Agent, or Firm* — John J. Penny, Jr.; Womble Bond Dickinson (US) LLP

(57) ABSTRACT

The present disclosure relates to a method of producing a multilayer hexagonal boron nitride (h-BN) thick film on a substrate, and more particularly, to a method of forming a multilayer h-BN thick film on a substrate including (a) a substrate heating step of heating a first substrate, (b) a h-BN precursor supply step of supplying h-BN precursors to the heated first substrate, (c) a precursor dissolving step of dissolving the supplied h-BN precursors in the first substrate, and (d) a substrate cooling step of cooling the first substrate containing the dissolved h-BN precursors therein, and a laminate including a multilayer h-BN thick film prepared by the preparation method and a substrate which forms a stack structure with the h-BN thick film.

8 Claims, 6 Drawing Sheets

(51) Int. Cl.
*C25B 1/02* (2006.01)
*C01B 21/064* (2006.01)

(52) U.S. Cl.
CPC .......... *C23C 16/0209* (2013.01); *C23C 16/56* (2013.01); *C25B 1/02* (2013.01); *C01P 2002/82* (2013.01); *C01P 2004/01* (2013.01); *C01P 2004/03* (2013.01); *C01P 2004/04* (2013.01)

(56) References Cited

U.S. PATENT DOCUMENTS

2013/0140526 A1 6/2013 Kim et al.
2013/0323150 A1 12/2013 Jeon et al.

FOREIGN PATENT DOCUMENTS

| KR | 101212717 B1 | 12/2012 |
| KR | 2013-0063410 A | 6/2013 |

OTHER PUBLICATIONS

Song et al "Large Scale Growth and Characterization of Atomic Hexagonal Boron Nitride Layers" Nano Letters (2010) p. 3209-3215.*
Wang et al "Electrochemical Delamination of CVD-Grown Graphene Film; Toward the Recycable Use of Copper Catalyst" ACSNano vol. 5, No. 12, (2011) p. 9927-9933.*
Lee, K., et al., Large-scale synthesis of high-quality hexagonal boron nitride nanosheets for large-area graphene electronics. Nano Lett, American Chemical Society, 2012;12:714-718.
Lee, Y., et al., Growth selectivity of hexagonal-boron nitride layers on Ni with various crystal orientations. RSC Advances, 2012;2:111-115.
Shi, et al., Synthesis of few-layer hexagonal boron nitride thin film by chemical vapor deposition. Nano Lett, American Chemical Society, 2010;10:4134-4139.
Park, J-H et al., "Large-Area Monolayer Hexagonal Boron Nitride on Pt Foil," ACS Nano, 2014, v. 8, pp. 8520-8528.

* cited by examiner

FORMATION METHOD OF HEXAGONAL BORON NITRIDE THICK FILM ON A SUBSTRATE AND HEXAGONAL BORON NITRIDE THICK FILM LAMINATES THEREBY

TECHNICAL FIELD

The present disclosure relates to a method of producing a multilayer hexagonal boron nitride (h-BN) thick film on a substrate.

More particularly, the present disclosure relates to a method of forming a multilayer h-BN thick film on a substrate through (a) a substrate heating step of heating a first substrate; (b) a h-BN precursor supply step of supplying h-BN precursors to the heated first substrate; (c) a precursor dissolving step of dissolving the supplied h-BN precursors in the substrate; and (d) a substrate cooling step of cooling the first substrate in which the h-BN precursors are dissolved.

Also, the present disclosure relates to a method which efficiently exfoliates the resulting multilayer h-BN thick film from the substrate and transfers the h-BN thick film to another substrate, and a laminate comprising the h-BN thick film.

BACKGROUND ART

Hexagonal boron nitride (h-BN) is a material with chemical formula BN, consisting of boron and nitrogen atoms in a planar two-dimensional hexagonal structure, and because it has chemical and physical properties similar to graphite due to having a hexagonal structure similar to graphite, its physical and chemical stability is high. In an inert atmosphere, it is stable up to 3,000° C., and has as high thermal conductivity as stainless steel and high thermal shock resistance, and is less susceptible to cracks or damage during repeated fast heating to about 1,500° C. and fast cooling. Also, high-temperature lubricity and corrosion resistance is considerably high. Further, it has an extraordinarily high electrical resistance value, particularly, with a small change in electrical resistance value at high temperature, and may be thus used as an electrical insulating material in a wide temperature range, and it is characterized in that it emits ultraviolet (UV) light when an electric field is applied. In addition, boron nitride is transparent, and due to a spatial space of a hexagonal honeycomb structure of boron and nitrogen atoms connected like a net, it is very flexible. The unique structure and properties of boron nitride may be applied to an insulation of a semiconductor material and a UV generator.

Recently, with the increasing demand and interest in nano technology, many studies are being made to prepare boron nitride, for example, in nanosheet or nanotube form.

Currently, a method of producing a hexagonal boron nitride nanosheet includes a mechanical exfoliation method, a chemical vapor deposition (CVD) method (Korean Patent No. 0433322), and a boron nitride interlayer compound method (Korean Patent No. 1212717), and generally, a CVD method and a mechanical exfoliation method are used to produce a hexagonal boron nitride nanosheet. i) The mechanical method is a method that exfoliates single-layer or multilayer boron nitride from hexagonal boron nitride in a solvent through ultrasonic wave treatment, and allows simple production but has a disadvantage of being difficult to mass produce. ii) The CVD method is generally a method that deposits a catalyst metal on a substrate to form a thin metal film, flows gas including boron and nitrogen at a high temperature of 1,000° C. or more, and cools to obtain a boron nitride nanosheet formed on the metal film, and has disadvantages of a very high process temperature and being unfavorable in terms of a large area and a cost.

Generally, the catalyst metal used in the CVD method has a polycrystalline structure, and thus, a considerable amount of boundaries of small-sized grains classified by the grain boundary exist on the surface of the catalyst. The large amount of grains and grain boundaries is one of the causes of degradation of surface quality of h-BN grown thereon. Thus, a related art drawn to a method of producing a hexagonal boron nitride sheet using a CVD method, for example, Korean Patent Application Publication No. 2013-0063410, discloses technology for preparing a thin film of h-BN by which sintering and thermal treatment is performed at high temperature to induce rearrangement of atoms within a metal catalyst, so that metal catalyst has an increased grain size and consequently a similar or same crystal face, and a thin film of h-BN is prepared using such a metal catalyst in a sheet form or the metal catalyst with a polished surface while supplying a nitrogen source and a boron source in gas phase.

Further, one of the Non-Patent Literatures, Nano Lett., 2012, 12, 714-718, discloses technology for synthesis of h-BN with ammonia borane at atmospheric pressure after thermal treatment and surface modification of a copper catalyst and its use in a graphene device, Nano Lett., 2010, 10, 4134-4139 discloses technology for production of h-BN in ten or less layers using a nickel catalyst, and RCS Advances, 2012, 2, 111-115 discloses technology for growth of h-BN in ten or more layers using a nickel catalyst, however all have a drawback of non-uniform growth of h-BN over the whole area.

These related arts simply increase a size of a crystal grain using thermal treatment of a metal catalyst having a small crystal grain size and a rough surface, or just improve the surface roughness through surface grinding of a metal catalyst, and as a consequence, quality of a resulting h-BN thin film is not good and it is impossible to accurately control the number of thin films of a resulting h-BN film, which makes it difficult to produce a single-layer thin film and even a thick film having a larger thickness, and they were only able to produce a h-BN film consisting of several layers.

Recently, with the development and market creation of nano electronic devices, as the need for development of materials with improved insulation characteristics and materials applicable as a buffer layer is growing, there is a continuously and gradually increasing demand for h-BN that may act as a high-performance insulation layer, and accordingly, there is a need for development of a method of forming a h-BN thick film on a substrate and a h-BN thick film laminate produced thereby.

RELATED LITERATURES

Patent Literature (Patent Literature 0001) Korean Patent No. 0433322
(Patent Literature 0002) Korean Patent No. 1212717
(Patent Literature 0003) Korean Patent Application Publication No. 2013-0063410

Non-Patent Literature (Non-Patent Literature 0001) Nano Lett., 2012, 12, 714-718.

(Non-Patent Literature 0002) Nano Lett., 2010, 10, 4134-4139.

(Non-Patent Literature 0003) RCS Advances, 2012, 2, 111-115.

DISCLOSURE

Technical Problem

As technology for solving the above problems of the related arts, the present disclosure is directed to providing a multilayer hexagonal boron nitride (h-BN) thick film having a very large thickness on a substrate by a chemical vapor deposition (CVD) method.

Also, the present disclosure is directed to providing a method of producing a high-quality h-BN thick film with no influence of a crystal grain size and a grain boundary of a metal catalyst on the quality of a resulting h-BN thick film.

Further, the present disclosure is directed to providing a method of producing a large-area multilayer h-BN thick film having a large thickness that was not attained by a related art.

Also, the present disclosure is directed to providing a method that efficiently exfoliates a resulting high-quality uniform multilayer h-BN thick film from a metal catalyst substrate, and efficiently transfers it to another substrate and a laminate comprising the h-BN thick film.

Technical Solution

To achieve the objects, the present disclosure provides a method of forming a multilayer hexagonal boron nitride (h-BN) thick film on a substrate, including (a) a substrate heating step of heating a first substrate, (b) a h-BN precursor supply step of supplying h-BN precursors to the heated first substrate, (c) a precursor dissolving step of dissolving the supplied h-BN precursors in the first substrate, and (d) a substrate cooling step of cooling the first substrate containing the dissolved h-BN precursors therein.

The method of forming a multilayer h-BN thick film on a substrate according to one aspect of the present disclosure may, after the substrate cooling step, further include a second substrate forming step of forming a second substrate on the cooled substrate.

The method of forming a multilayer h-BN thick film on a substrate according to one aspect of the present disclosure may, after the second substrate forming step, further include a h-BN thick film separation step of separating a h-BN thick film from the first substrate in an aqueous solution.

The method of forming a multilayer h-BN thick film on a substrate according to one aspect of the present disclosure may, after the h-BN thick film separation step, further include a h-BN thick film transferring step of transferring the h-BN thick film on a third substrate.

The method of forming a multilayer h-BN thick film on a substrate according to one aspect of the present disclosure may, after the h-BN transferring step further include a second substrate removing step of removing the second substrate.

The first substrate in the method of forming a multilayer h-BN thick film on a substrate according to one aspect of the present disclosure may be any one selected from the group consisting of gold (Au), copper (Cu), iron (Fe), manganese (Mn), nickel (Ni), cobalt (Co), palladium (Pd), titanium (Ti), and platinum (Pt).

The second substrate in the method of forming a multilayer h-BN thick film on a substrate according to one aspect of the present disclosure may be at least one selected from the group consisting of a polymer, an adhesive tape, a heat peelable tape, and a photoresist.

The h-BN thick film separating step of the method of forming a multilayer h-BN thick film on a substrate according to one aspect of the present disclosure may include separating the h-BN thick film using hydrogen produced at an interface between the first substrate and the h-BN thick film by connecting a minus electrode to the first substrate and connecting a plus electrode to a separate counter electrode in an aqueous solution.

The third substrate in the method of forming a multilayer h-BN thick film on a substrate according to one aspect of the present disclosure may be any one selected from the group consisting of a flexible substrate, a conductive material, a dielectric material, and a semiconductor material.

There is provided a h-BN thick film laminate including a multilayer h-BN thick film prepared by the preparation method according to one aspect of the present disclosure, and a substrate which forms a stack structure with the h-BN thick film.

Advantageous Effects

The present disclosure relates to a method of growing a hexagonal boron nitride (h-BN) thick film of a thick layer having a large thickness of several nanometers on a substrate and its h-BN thick film laminate, and the resulting h-BN thick film is in a sheet form serving as a high-performance insulation layer and may be thus used not only in the field requiring insulation characteristics for various electronic devices but also as a buffer layer.

Further, because the multilayer h-BN thick film having a large thickness is in a uniform sheet form, it may be used as anti-oxidation coating and a substrate of a two-dimensional material using insulation characteristics unique to h-BN, and by the use of a method of exfoliating the h-BN thick film from the substrate without damage, the substrate may be repeatedly used, resulting in high economical efficiency.

DISCLOSURE FOR CARRYING OUT THE INVENTION

Figure 1:
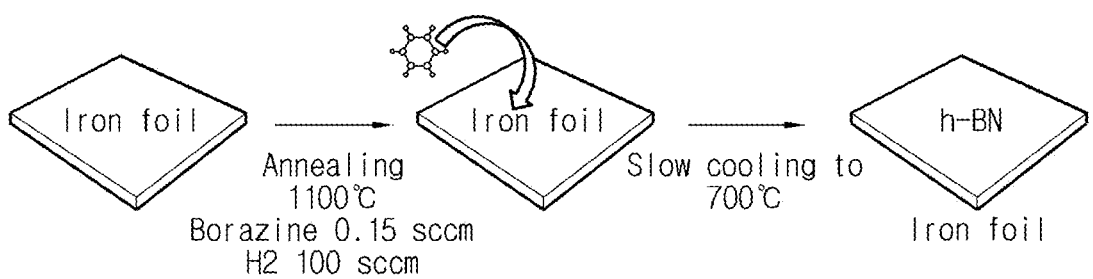
FIG. 1 is a flowchart of a method of producing a multilayer h-BN thick film on a substrate according to an aspect of the present disclosure.

Hereinafter, the present disclosure will be described in detail. It should be understood that the terms or words used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

A method of forming a multilayer hexagonal boron nitride (h-BN) thick film on a substrate according to one aspect of the present disclosure includes (a) a substrate heating step of heating a first substrate; (b) a h-BN precursor supply step of supplying h-BN precursors to the heated first substrate; (c) a precursor dissolving step of dissolving the supplied h-BN precursors in the substrate; and (d) a substrate cooling step of cooling the first substrate containing the dissolved h-BN precursors therein.

The method may further include a second substrate forming step of forming a second substrate on the cooled substrate after the substrate cooling step.

The method may further include a h-BN thick film separating step of separating the h-BN thick film from the first substrate in an aqueous solution after the second substrate forming step.

The method may further include a h-BN transferring step of transferring the h-BN thick film onto a third substrate after the h-BN thick film separating step.

The method may further include a second substrate removing step of removing the second substrate after the h-BN transferring step.

The first substrate may be any one selected from the group consisting of gold (Au), copper (Cu), iron (Fe), manganese (Mn), nickel (Ni), cobalt (Co), palladium (Pd), titanium (Ti), and platinum (Pt). More preferably, the first substrate may be iron (Fe).

The second substrate may be at least one selected from the group consisting of a polymer, an adhesive tape, a heat peelable tape, and a photoresist.

The h-BN thick film separating step may include connecting a minus electrode to the first substrate, connecting a plus electrode to a separate counter electrode in the aqueous solution to separate the h-BN thick film using hydrogen produced at the interface between the first substrate and the h-BN thick film.

The third substrate may be any one selected from the group consisting of a flexible substrate, a conductive material, a dielectric material, and a semiconductor material.

The h-BN thick film laminate according to one aspect of the present disclosure may include a multilayer h-BN thick film prepared by the preparation method; and a substrate which forms a stack structure with the h-BN thick film.

The following table 1 enumerates the types of metals usable as a first substrate and melting temperatures of corresponding metals.

TABLE 1

| | First substrate | | | | | | | |
|---|---|---|---|---|---|---|---|---|
| | Au | Cu | Fe | Mn | Ni | Co | Pd | Ti | Pt |
| Melting temperature (° C.) | 1,063 | 1,084 | 1,150 | 1,244 | 1,453 | 1,495 | 1,555 | 1,670 | 1,770 |

FIG. 1 is a flowchart of a method of producing a multilayer h-BN thick film on a substrate according to an aspect of the present disclosure.

First, summing the entire process, on condition that an iron foil is used as a first substrate, the first substrate is heated to 1,100° C., and h-BN precursors, borazine and hydrogen, are supplied in a predetermined amount, and due to a very high solubility of the supplied precursors for the iron foil, the precursors are dissolved to the limit solubility when heated, and subsequently, the substrate is slowly cooled to 700° C., and as the limit solubility of the iron foil starts to reduce, the precursors are precipitated to form a multilayer h-BN thick film having a large thickness on the first substrate or the iron foil.

Figure 2:
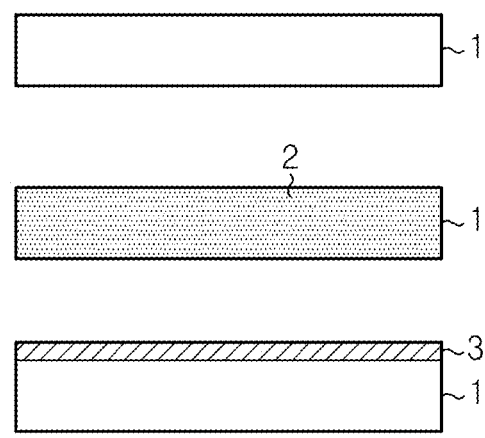
FIG. 2 is a conceptual diagram of a method of producing a multilayer h-BN thick film on a substrate according to an aspect of the present disclosure.

A further detailed description of the step of producing a multilayer h-BN thick film on a substrate is provided with reference to FIG. 2.

First, (a) a first substrate heating step of heating a first substrate is a step of heating a first substrate made from at least one metal selected from the group consisting of gold (Au), copper (Cu), iron (Fe), manganese (Mn), nickel (Ni), cobalt (Co), palladium (Pd), titanium (Ti), and platinum (Pt), or alloys thereof. As previously described in FIG. 1, the first substrate includes any material having high solubility for h-BN precursors when heated, more preferably iron foil.

(b) a h-BN precursor supply step of supplying h-BN precursors to the heated first substrate is a step of supplying precursors of h-BN, for example, gas-phase nitrogen source and boron source, to the heated first substrate.

The gas-phase nitrogen source and boron source may be supplied at a predetermined flow rate and may be supplied in an inert atmosphere or a reducing atmosphere. The inert atmosphere may be created by using inert gas such as argon and helium, and the reducing atmosphere may be created by using hydrogen gas.

The nitrogen source is not limited to a particular type if it can supply nitrogen atoms in gas phase, and may include at least one selected from $NH_3$ and $N_2$. Also, the boron source is not limited to a particular type if it can supply boron atoms in gas phase, and may include at least one selected from $BH_3$, $BF_3$, $BCl_3$, $B_2H_6$, $(CH_3)_3B$, $(CH_3CH_2)_3B$, and borazine-based compounds.

Only if the nitrogen source and the boron source are supplied in gas phase, it does not require that raw materials themselves be in gas phase, and evaporation of a solid-phase nitrogen and boron-containing material in an outdoor container may be contemplated, and the solid-phase nitrogen and boron source stored in the outdoor container may be an ammonia-borane ($NH_3$—$BH_3$) compound.

Subsequently, (c) a precursor dissolving step of dissolving the supplied h-BN precursors in the first substrate is, as shown in FIG. 2, a step of dissolving the h-BN precursor inside the heated first substrate. Because the dissolved precursors are precipitated on the first substrate in a subsequent cooling step to form a h-BN thick film, it is preferred that a large amount of h-BN precursors is dissolved in the first substrate. Thus, it is preferred to use a first substrate having high solubility for the h-BN precursors, more preferably an iron foil. In this instance, to further improve the solubility of the h-BN precursors for the first substrate, a high pressure condition may be used.

Subsequently, (d) a substrate cooling step of cooling the first substrate containing the dissolved h-BN precursors therein is a step in which while the first substrate containing the dissolved h-BN precursors therein is slowly cooling to 700° C., as the limit solubility of the h-BN precursors for the iron foil starts to reduce, the h-BN precursors are precipitated to form a multilayer h-BN thick film having a large thickness on the first substrate or the iron foil as shown in FIG. 2.

Figure 3:
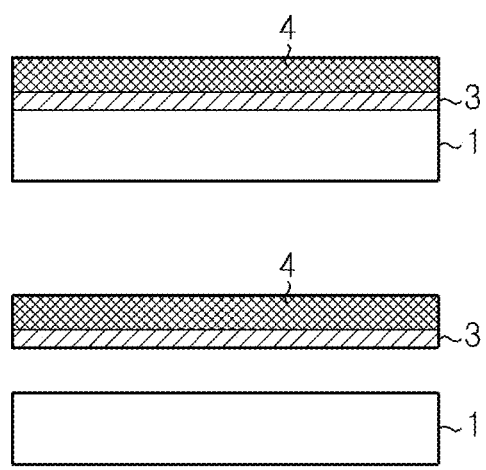
FIG. 3 is a conceptual diagram illustrating a second substrate forming step of forming a second substrate on a h-BN thick film and a h-BN thick film separating step of separating the h-BN thick film from a first substrate after a h-BN thick film forming step according to an aspect of the present disclosure.

A more detailed description of the step of separating the multilayer h-BN thick film from the first substrate is provided with reference to FIG. 3.

The second substrate forming step of forming a second substrate on the cooled substrate after the substrate cooling step is a step of forming a second substrate on the multilayer h-BN thick film having a large thickness formed through the substrate cooling step during which the h-BN precursors dissolved in the first substrate are precipitated on the surface of the first substrate. The second substrate may be at least one selected from the group consisting of a polymer, an adhesive tape, a heat peelable tape, and a photoresist, and the polymer may be selected from the group consisting of polyethyleneterephthalate (PET), polyethylenesulfone (PES), polyethylenenaphthalate (PEN), polycarbonate (PC), polymethylmethacrylate (PMMA), polyimide (PI), ethylenevinylacetate (EVA), polypropyleneterephthalate (PPT), polyethyleneterephthalateglycerol (PETG), polycyclohexylenedimethyleneterephthalate (PCTG), modified triacetylcellulose (TAC), cycloolefinpolymer (COP), cycloolefin copolymer (COC), dicyclopentadienepolymer (DCPD), cyclopentadienepolymer (CPD), polyarylate (PAR), polyetherimide (PEI), polydimethylsiloxane (PDMS), silicone resin, fluorine resin, and modified epoxy resin.

Also, a method of forming the second substrate, for example, the polymer includes a known polymer coating method such as spraying, dip coating, and spin coating, using a mixture of the polymer and a solvent, and according to the necessity, the polymer may be formed on the h-BN thick film through polymerization and cross linking after coating a mixture of a monomer and a cross-linking agent on the h-BN thick film. Also, in the case of the adhesive tape and the heat peelable tape, the second substrate may be formed through compression of each tape.

The second substrate acts to support h-BN until the h-BN thick film separating step of separating the produced h-BN thick film from the first substrate or the h-BN transferring step of transferring to the third substrate, and after the h-BN thick film is separated from the first substrate, the h-BN thick film may be separated by removing the second substrate using a solvent or heat, and may be separated concurrently with the h-BN transferring step of transferring h-BN to the third substrate or after the h-BN transferring step.

The h-BN thick film separating step of separating the h-BN thick film from the first substrate in the aqueous solution after the second substrate forming step is a step of separating the h-BN thick film from the interface with the first substrate using hydrogen produced on the surface of the first substrate by applying minus voltage to a laminate with the second substrate in an alkaline solution atmosphere and applying plus voltage to a separate counter metal in an alkaline solution.

As shown in FIG. 3, the h-BN thick film is separated by the hydrogen gas produced at the interface between the first substrate and the h-BN thick film, but not an external mechanical force or other means, so separation of the h-BN thick film from the first substrate is efficiently enabled without damage to the surface. Also, the first substrate remaining after separating the h-BN thick film may be repeatedly used to prepare a h-BN thick film after cleaning.

The h-BN transferring step of transferring h-BN to a third substrate after the h-BN thick film separating step is a step of transferring h-BN in a contact state of the surface of the separated h-BN thick film and a third substrate to which h-BN is transferred. The third substrate is any one of a flexible substrate, a conductive material, a dielectric material, and a semiconductor material, and more preferably, the flexible substrate is any one of polyethyleneterephthalate (PET), polyethylenesulfone (PES), polyethylenenaphthalate (PEN), polycarbonate (PC), polymethylmethacrylate (PMMA), and polyimide (PI), the conductive material is graphene, the dielectric material is any one of $MoS_2$ and BCN, and the semiconductor material is silicone or a silicon wafer. Also, the transfer method includes those performed by a dry process, a wet process, or a roll-to-roll process, but is not limited thereto.

The second substrate removing step of removing the second substrate after the h-BN transferring step is a step of removing the second substrate using a solvent or heat. In the case where the second substrate is a solvent-soluble material such as a polymer or a photoresist, the second substrate may be removed using a solvent, in the case where the second substrate is an adhesive tape, the second substrate may be removed by a mechanical method, and in the case where the second substrate is a heat peelable tape, the second substrate may be removed by heating.

The h-BN thick film laminate according to the present disclosure is provided including a single-layer h-BN thin film prepared by the above preparation method; and a substrate which forms a stack structure with the h-BN thin film.

The substrate which forms a stack structure may be at least one selected from the group consisting of the first substrate, the second substrate, and the third substrate.

Hereinafter, the embodiments of the present disclosure will be described in detail to assist the understanding of the present disclosure. However, the embodiments of the present disclosure may be modified in different forms and the scope of the present disclosure should not be construed as being limited to the embodiments set forth below. Rather, these embodiments are provided so that this disclosure will fully convey the scope of the present disclosure to one of ordinary skill in the art.

Example 1: Production of a h-BN Thick Film (See FIGS. 1 and 2)

As a first substrate 1, an iron foil having a size of 2 cm×10 cm sufficient to enter a CVD chamber was used. As a h-BN precursor for producing a h-BN thick film, i.e., a nitrogen source and a boron source, borazine ($H_3B_3N_3H_3$) was used. Because one molecule of borazine consists of three nitrogen atoms and three boron atoms, borazine is a type of unsaturated boron nitride having a similar hexagonal crystal structure to h-BN, and has a melting point of 57° C. and a boiling point of 55° C. Thus, because borazine exists in a liquid state at room temperature, it is preferred to use borazine while maintaining the temperature at 10° C. using a cooler to maintain a constant vapor pressure without influence of room temperature, and because borazine is less prone to gasify at the temperature below zero, borazine in a liquid state is diluted with hydrogen introduced through a pipe, and gaseous borazine is supplied and used as a precursor for producing a h-BN thick film, thereby providing advantages of easier flow rate control and not producing solid impurities as compared to other precursors in a solid state.

A surface treatment process of the iron foil includes removing organic impurities using an organic solvent such as acetone, isopropanol, and ethanol and washing with distilled water. Prior to heating the iron foil, outside air particles and moisture were removed using a dry pump for about 1 hour to place the inside of the CVD chamber into a vacuum state ($1\times10^{-4}$ Torr or less), and a flow of hydrogen gas was supplied at a flow rate of 100 sccm under the pressure of 1 Torr. Subsequently, the iron foil within the CVD chamber was heated from room temperature to 1,100° C. for 30 minutes, and when the temperature reaches 1,100° C., it was maintained at 1,100° C. for 30 minutes for thermal stability. The iron foil is in a higher solubility state for nitrogen and boron at 1,100° C. than at room temperature, and in this condition, borazine as a precursor of h-BN is supplied in an amount of 0.15 sccm together with carrier gas, 100 sccm of hydrogen, and the precursor was dissolved in the iron foil or the first substrate for 1 hour. Subsequently, the iron foil containing the dissolved precursor of h-BN was slowly cooled down to 700° C. at a rate of 5/min, and during this cooling process, a h-BN thick film 3 was formed on the iron foil from borazine the h-BN precursor dissolved in the iron foil.

Example 2: Separation of a h-BN Thick Film (See FIG. 3)

A separation process of a h-BN thick film (a floating in bath (FIB) process) is as follows. First, a h-BN/iron foil substrate was placed on a clearly washed PET film, and fixed with a scotch tape around the edges to coat only an upper part of h-BN with a second substrate 4 such as a polymer. As the second substrate used in the thick film separation process, a mixture of 950 PMMA A9 and anisole at a volume ratio of 1:1 was used. The 950 PMMA A9 is a product in which about 9-11 wt % of PMMA is dissolved in anisole, and a concentration of a polymer coating solution prepared by mixing with anisole at a volume ratio of 1:1 is about 4-6 wt %. The polymer coating solution was dropped on the h-BN/iron foil, and spin coating was performed using a spin coater at a rate of 2500 rpm for 1 minute. After the h-BN/iron foil coated with the PMMA polymer was put in an oven of 80° C. for about 1 hour to evaporate a solvent, the tape part for fixing was removed. As an aqueous solution used to separate a h-BN thick film, 500 mL of a 0.25M sodium hydroxide aqueous solution was used, and in the presence of hydrogen produced on the iron foil substrate surface by applying minus voltage to the h-BN/iron foil substrate and applying plus voltage to a counter metal (platinum) under the voltage and current conditions of 10V and 1.8 A, the PMMA/h-BN thick film laminate is separated from the iron foil and floats on the surface of the sodium hydroxide aqueous solution. The iron foil from which the PMMA/h-BN thick film laminate has been separated was taken out of the aqueous solution, and washed with acetone, IPA, or ethanol, and afterwards, was repeatedly used.

Example 3: Transfer of a h-BN Thick Film

As the separated PMMA/h-BN thick film laminate floats on the sodium hydroxide aqueous solution, the PMMA/h-BN thick film laminate was moved to distilled water using a clean PET or glass substrate and washed repeatedly three times to remove the sodium hydroxide aqueous solution. The washing with distilled water was performed at an interval of twenty minutes, and after washing, a pH of the distilled water was measured using a litmus paper to identify a base-free state. In the transfer of the washed PMMA/h-BN thick film laminate to a desired clean third substrate, a plate-like substrate of $SiO_2$/Si, Si, quartz, PET, or glass was used as a third substrate to which the thick film will be transferred, and the PMMA/h-BN thick film laminate was put in an oven of 80° C. standing erect while being in contact with the substrate to evaporate moisture for about 1 hour so that the h-BN thick film was transferred to the substrate better.

Then, the second substrate, PMMA, was removed using acetone and heat was additionally applied using a thermal treatment tool for about 5 hours under the conditions of 450° C., 700 sccm argon, 300 sccm hydrogen, and atmospheric pressure to completely remove PMMA remaining on the h-BN thick film through pyrolysis.

Example 4: Shape Analysis Result of a Resulting h-BN Thick Film

Figure 4A:
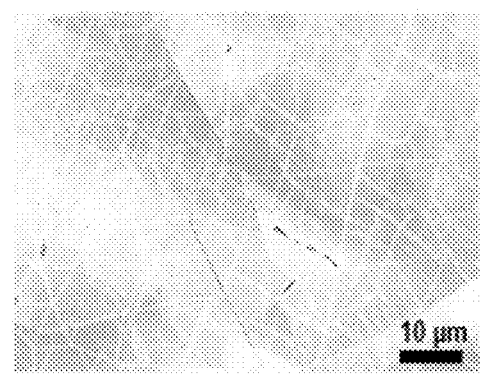
FIGS. 4A and 4B show a scanning electronic microscopic (SEM) image and a transmission electronic microscopic (TEM) image of a h-BN thick film produced according to an aspect of the present disclosure.

FIG. 4A shows a result of observing the surface of h-BN on the h-BN/iron foil using a field emission scanning electronic microscope (FE-SEM) through the example 1, and it was found that the surface of the resulting h-BN thick film was smooth and uniform. In FIG. 4A, a fine line indicates a h-BN crystal boundary.

Figure 4B:
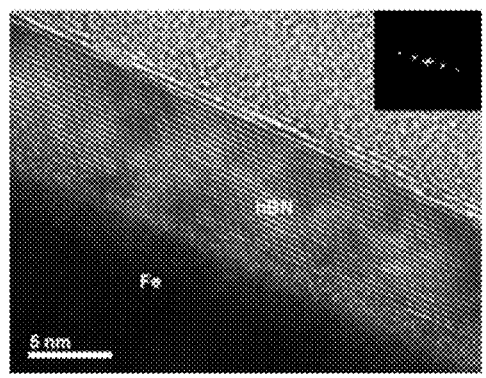

FIG. 4B shows a result of observing the cross section of the h-BN thick film grown on the iron foil through the example 1 and the iron foil using a transmission electronic microscope (TEM), and it was found that the resulting h-BN thick film was composed of a plurality of layers (approximately 20 layers or more).

Figure 5A:
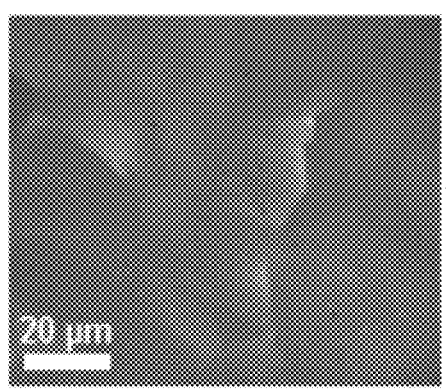
FIGS. 5A and 5B show an optical image and a Raman mapping image of a h-BN thick film produced according to an aspect of the present disclosure.

FIG. 5A shows a result of observing the surface of the h-BN thick film separated from the iron foil through the example 2 using an optical microscope, and it was found that the surface of the resulting h-BN thick film was smooth and slightly non-uniform and had a large-scale area.

Figure 5B:
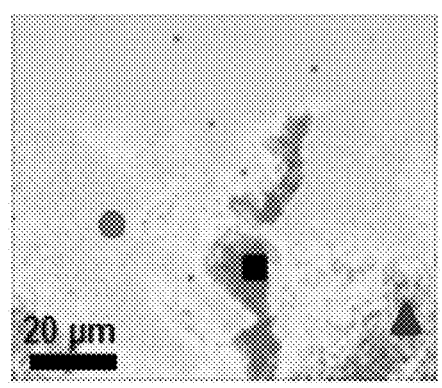

FIG. 5B is a Raman mapping image of the h-BN thick film on the same part as FIG. 5A, and it was found that the entire h-BN thick film was grown thick although it was non-uniform a little.

Figure 6:
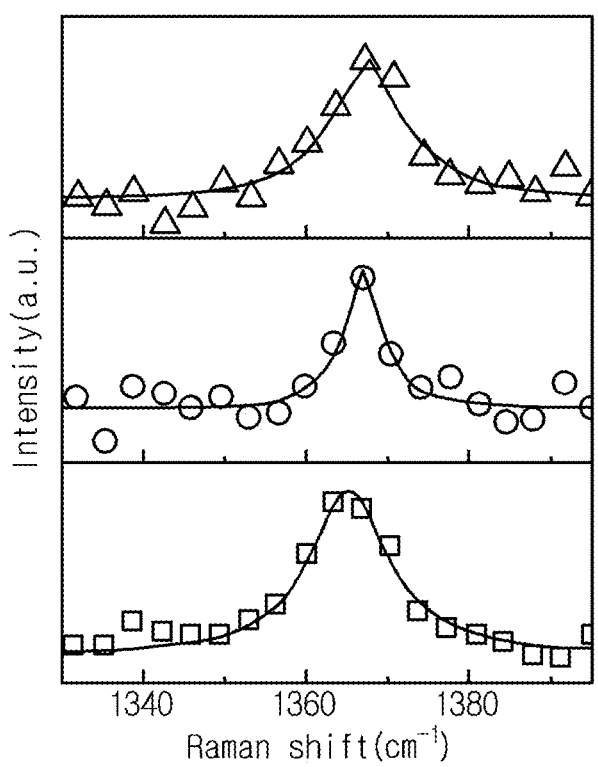
FIG. 6 illustrates Raman peaks based on a thickness change of a h-BN thick film produced according to an aspect of the present disclosure.

FIG. 6 shows Raman peaks of three parts of the h-BN thick film in FIG. 5B, and it was found that the h-BN thick film did not show all the same peak but was grown thick.

DESCRIPTION OF REFERENCE NUMERAL

1: first substrate 2: h-BN precursor 3: h-BN thick film 4: second substrate

What is claimed is:

1. A method of forming a multilayer hexagonal boron nitride (h-BN) thick film on a substrate, the method comprising:
    (a) a substrate heating step of heating a first substrate comprising iron (Fe);
    (b) a h-BN precursor supply step of supplying h-BN precursors comprising borazine ($H_3B_3N_3H_3$) to the heated first substrate;
    (c) a precursor dissolving step of dissolving the supplied h-BN precursors in the first substrate;
    (d) a substrate cooling step of cooling the first substrate containing the dissolved h-BN precursors therein; and
    (e) a formation step of multilayer h-BN thick film on a surface of the first substrate from the dissolved h-BN precursors therein.

2. The method of forming a multilayer h-BN thick film on a substrate according to claim 1, after the substrate cooling step further comprising:
    a second substrate forming step of forming a second substrate on the cooled substrate.

3. The method of forming a multilayer h-BN thick film on a substrate according to claim 2, after the second substrate forming step further comprising:

a h-BN thick film separation step of separating a h-BN thick film from the first substrate in an aqueous solution.

4. The method of forming a multilayer h-BN thick film on a substrate according to claim 3, after the h-BN thick film separation step further comprising:

a h-BN thick film transferring step of transferring the h-BN thick film on a third substrate.

5. The method of forming a multilayer h-BN thick film on a substrate according to claim 4, after the h-BN transferring step further comprising:

a second substrate removing step of removing the second substrate.

6. The method of forming a multilayer h-BN thick film on a substrate according to claim 2, wherein the second substrate is at least one selected from the group consisting of a polymer, an adhesive tape, a heat peelable tape, and a photoresist.

7. The method of forming a multilayer h-BN thick film on a substrate according to claim 3, wherein the h-BN thick film separating step comprises separating the h-BN thick film using hydrogen produced at an interface between the first substrate and the h-BN thick film by connecting a minus electrode to the first substrate and connecting a plus electrode to a separate counter electrode in an aqueous solution.

8. The method of forming a multilayer h-BN thick film on a substrate according to claim 4, wherein the third substrate is any one selected from the group consisting of a flexible substrate, a conductive material, a dielectric material, and a semiconductor material.

* * * * *